United States Patent
Zhang (10) Patent No.: US 11,201,196 B2
(45) Date of Patent: Dec. 14, 2021

(54) DISPLAY PANEL HAVING CAMERA AND NORMAL DISPLAY SUB-AREAS

(71) Applicant: Wuhan China Star Optoelectronics Semiconductor Display Technology Co., Ltd., Hubei (CN)

(72) Inventor: Fuyang Zhang, Hubei (CN)

(73) Assignee: Wuhan China Star Optoelectronics Semiconductor Display Technology Co., Ltd., Hubei (CN)

(*) Notice: Subject to any disclaimer, the term of this patent is extended or adjusted under 35 U.S.C. 154(b) by 22 days.

(21) Appl. No.: 16/623,429

(22) PCT Filed: Nov. 5, 2019

(86) PCT No.: PCT/CN2019/115782
§ 371 (c)(1),
(2) Date: Dec. 17, 2019

(87) PCT Pub. No.: WO2021/017251
PCT Pub. Date: Feb. 4, 2021

(65) Prior Publication Data
US 2021/0036071 A1 Feb. 4, 2021

(30) Foreign Application Priority Data
Jul. 31, 2019 (CN) .......................... 201910700211.9

(51) Int. Cl.
*H01L 27/32* (2006.01)
*H01L 51/00* (2006.01)
(Continued)

(52) U.S. Cl.
CPC ...... *H01L 27/3234* (2013.01); *H01L 27/3244* (2013.01); *H01L 51/0097* (2013.01);
(Continued)

(58) Field of Classification Search
CPC ............. H01L 27/3234; H01L 27/3244; H01L 51/0097; H01L 51/5253
See application file for complete search history.

(56) References Cited

U.S. PATENT DOCUMENTS 10,009,525 B2 * 6/2018 Mathew ............ G02F 1/133528
10,559,604 B2 * 2/2020 Zhan ..................... H01L 27/124
(Continued)

FOREIGN PATENT DOCUMENTS

CN 104158924 A 11/2014
CN 109860266 A 6/2019
(Continued)

OTHER PUBLICATIONS

Microelectronics Packaging Technology; Apr. 30, 2003; pp. 226-229.

*Primary Examiner* — Ida M Soward
(74) *Attorney, Agent, or Firm* — Taft Stettinius & Hollister LLP (57) ABSTRACT

A display panel includes a display area. The display area includes a camera sub-area and a normal display sub-area. The display panel further includes a substrate, a thin film transistor layer, an organic light emitting layer, and an encapsulation layer disposed in sequence. A thickness of a region of the substrate corresponding to the camera sub-area is less than a thickness of a region of the substrate corresponding to the normal display sub-area. A via hole is provided in regions of the thin film transistor layer and the organic light emitting layer corresponding to the camera sub-area.

7 Claims, 6 Drawing Sheets

(51) Int. Cl.
*H01L 51/52* (2006.01)
*H01L 27/146* (2006.01)

(52) U.S. Cl.
CPC .... *H01L 51/5253* (2013.01); *H01L 27/14627* (2013.01); *H01L 2227/323* (2013.01); *H01L 2251/5338* (2013.01)

(56) References Cited

U.S. PATENT DOCUMENTS

| | | | |
|---|---|---|---|
| 10,804,346 B2* | 10/2020 | Wang | G02B 27/0955 |
| 10,910,790 B2* | 2/2021 | Kim | H01S 5/02469 |
| 10,919,326 B2* | 2/2021 | Nashner | B44C 3/005 |
| 2014/0333830 A1 | 11/2014 | Cheon | |
| 2019/0051670 A1* | 2/2019 | Bei | H01L 27/3276 |
| 2020/0059713 A1* | 2/2020 | Noh | H04R 1/028 |
| 2020/0103973 A1* | 4/2020 | Ahn | G06F 1/1684 |
| 2020/0106939 A1* | 4/2020 | Yang | G02F 1/13318 |
| 2020/0117034 A1* | 4/2020 | Yin | G02F 1/133528 |
| 2020/0212363 A1* | 7/2020 | Park | H01L 51/5215 |
| 2020/0236259 A1* | 7/2020 | Nakamura | H01L 51/5253 |
| 2020/0258957 A1* | 8/2020 | Kwak | H01L 27/323 |
| 2020/0287161 A1* | 9/2020 | Kim | H01L 27/326 |

FOREIGN PATENT DOCUMENTS

| | | |
|---|---|---|
| CN | 109920822 A | 6/2019 |
| CN | 110047878 A | 7/2019 |

\* cited by examiner

DISPLAY PANEL HAVING CAMERA AND NORMAL DISPLAY SUB-AREAS

CROSS-REFERENCE TO RELATED APPLICATIONS

This application is a U.S. National Phase of International PCT Application No. PCT/CN2019/115782 filed Nov. 5, 2019, which claims the benefit of Chinese Patent Application Serial No. 201910700211.9 filed Jul. 31, 2019, the contents of each application are incorporated herein by reference in their entirety.

FIELD OF INVENTION

The present disclosure relates to a field of display technology, and particularly to a display panel, a method for fabricating the same, and a display device comprising the same.

BACKGROUND

Recently, with development of display technology, emergence of various screen technologies has provided unlimited possibilities for electronic terminals. In particular, display technologies typified by organic light emitting diodes (OLEDs) are widely used. Various mobile terminals with selling points such as "full screen", "special-shaped screen", "under-screen sound", "screen fingerprint" are rapidly promoted.

Full screen technology is a broad definition of an ultra-high screen ratio mobile phone design in display industry. Literally, a screen is disposed on an entire front surface of a mobile phone. A display interface of the mobile phone is completely covered by the screen, and positions corresponding to four frames of current mobile phones are designed to be frameless, so as to achieve an ultra-high screen ratio close to 100%. However, for a mobile phone, a front-facing camera, a handset, a distance sensor, a light sensor, and the like, are essential functional components. Therefore, a notch is required at a top of a current mobile phone screen to accommodate the above functional components. This screen is called a "notched screen". The full screen mobile phones called by the industry are just ultra-high screen ratio mobile phones. The industry has not made a mobile phone with 100% screen ratio on its front surface. The notched screen plus an ultra-narrow bezel design, a real screen ratio of a current mobile phone can reach 80-90%, and there is a certain distance from 100% full screen.

Demand for true full screens has been increasing. From a perspective of display technology, one of main difficulties is to balance contradiction between a front camera and a display panel. That is, the front camera is retained without damaging integrity of the display panel. One option is to place the camera below the display panel. For a flexible display panel, since visible light transmittance of a flexible substrate adopted at a large scale at current stage is generally low, when a camera is placed under the panel, external visible light is difficult to enter into the camera to form an image.

SUMMARY OF DISCLOSURE

The present disclosure provides a display panel, a method for fabricating the same, and a display device comprising the same to solve the technical problem, in the prior art, that a real full screen cannot be realized due to a need to ensure a lighting requirement of a camera.

In order to solve the aforementioned problem, the present disclosure provides a display panel comprising a display area. The display area comprises a camera sub-area and a normal display sub-area. The display panel comprises a substrate, a thin film transistor layer, an organic light emitting layer, and an encapsulation layer. A thickness of a region of the substrate corresponding to the camera sub-area is less than a thickness of a region of the substrate corresponding to the display sub-area. The thin film transistor layer is disposed on the substrate. The organic light emitting layer is disposed on the thin film transistor layer. The encapsulation layer is disposed on the organic light emitting layer. A via hole is disposed in regions of the thin film transistor layer and the organic light emitting layer corresponding to the camera sub-area.

Furthermore, the via hole is filled with a light transmissive material.

Furthermore, the substrate is a flexible substrate composed of a polyimide material.

Furthermore, a region of the substrate corresponding to the camera sub-area is provided with a recess, and an opening of the recess is disposed away from the thin film transistor layer.

Furthermore, the recess comprises a bottom surface that is shaped as an arc and is concave to the substrate.

Furthermore, the encapsulation layer is composed of at least one of silicon oxide, silicon nitride, silicon oxynitride, and amorphous silicon.

The present disclosure further provides a method for fabricating a display panel that comprises a display area and a camera area. The method comprises:

S1) providing a substrate;
S2) forming a thin film transistor layer on the substrate;
S3) forming an organic light emitting layer on the thin film transistor layer;
S4) forming a via hole in regions of the thin film transistor layer and the organic light emitting layer corresponding to the camera area;
S5) filling the via hole with a polyimide solution and curing the polyimide solution by heat or light; and
S6) forming an encapsulation layer on the organic light emitting layer.

Furthermore, in step S4), the via hole is formed by dry etching, wet etching, or laser etching.

The present disclosure further provides a display device comprising the display panel.

A display panel of the present disclosure, a method for fabricating the same, and a display device comprising the same improve a light transmittance and an imaging accuracy by forming a via hole in a camera area of the display panel and filling the via hole with a light transmissive material. Furthermore, by forming a lens-shaped recess on a substrate above a camera, light passing through the camera area is concentrated into the camera to improve brightness of a camera image.

BRIEF DESCRIPTION OF DRAWINGS

In order to more clearly illustrate the technical solutions in the embodiments of the present disclosure or the prior art, a brief description of accompanying drawings used in the description of the embodiments of the present disclosure or the prior art will be given below. The accompanying drawings in the following description are merely some embodiments of the present disclosure. For those skilled in the art.

In the accompanying drawings,

| | |
|---|---|
| 1: display device, | 10: display panel, |
| 11: display area, | 101: normal display sub-area, |
| 102: camera area, | 110: substrate, |
| 120: thin film transistor layer, | 20: camera, |
| 130: organic light emitting layer, | 140: encapsulation layer, |
| 1021: via hole, | 111: recess, and |
| 11101: bottom surface. | |

DETAILED DESCRIPTION

The following description of various embodiments of the present disclosure with reference to the accompanying drawings is used to illustrate specific embodiments that can be practiced. Directional terms mentioned in the present disclosure, such as "above", "below", "front", "rear", "left", "right", "top", and "bottom", are merely used to indicate the direction of the accompanying drawings. Therefore, the directional terms are used for illustrating and understanding the present disclosure rather than limiting the present disclosure.

Figure 3:
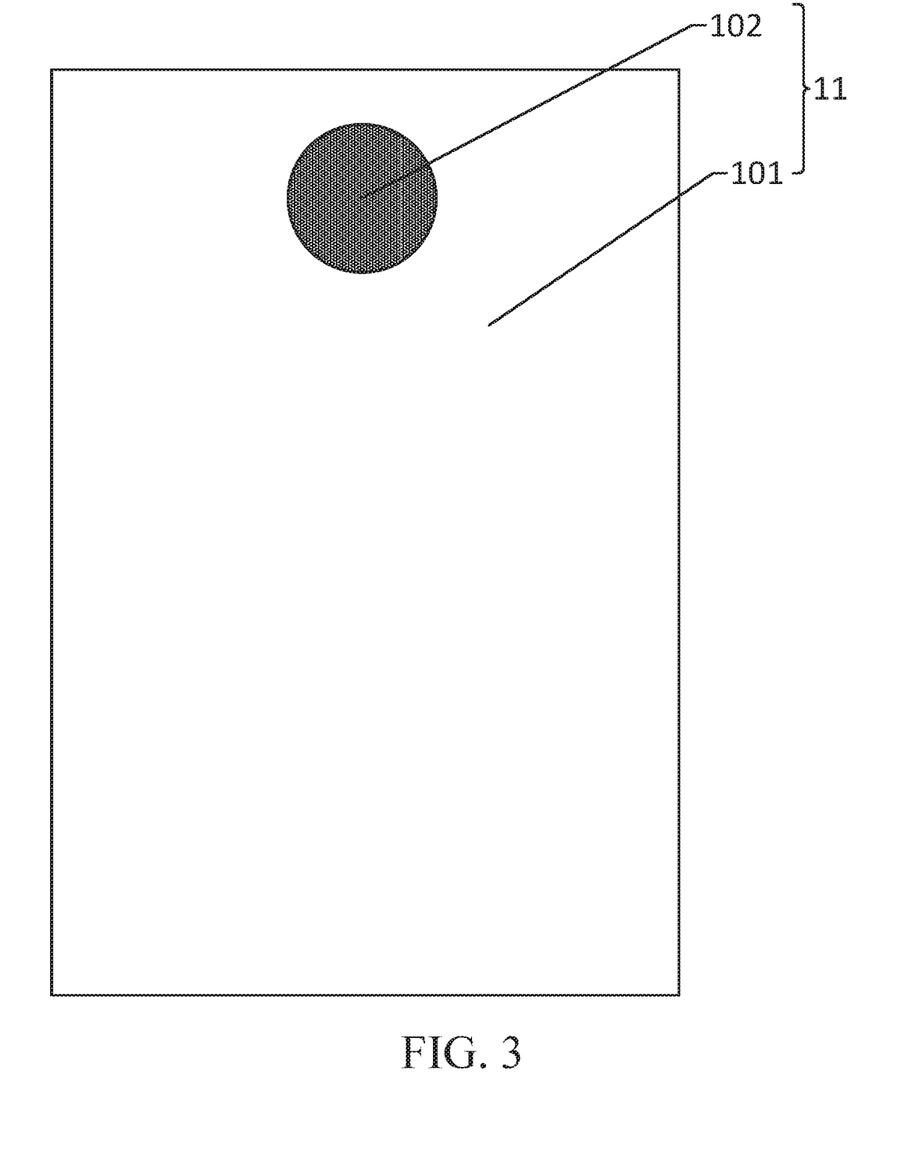
FIG. 3 is a schematic diagram of a camera area according to an embodiment of the present disclosure.
Figure 4:
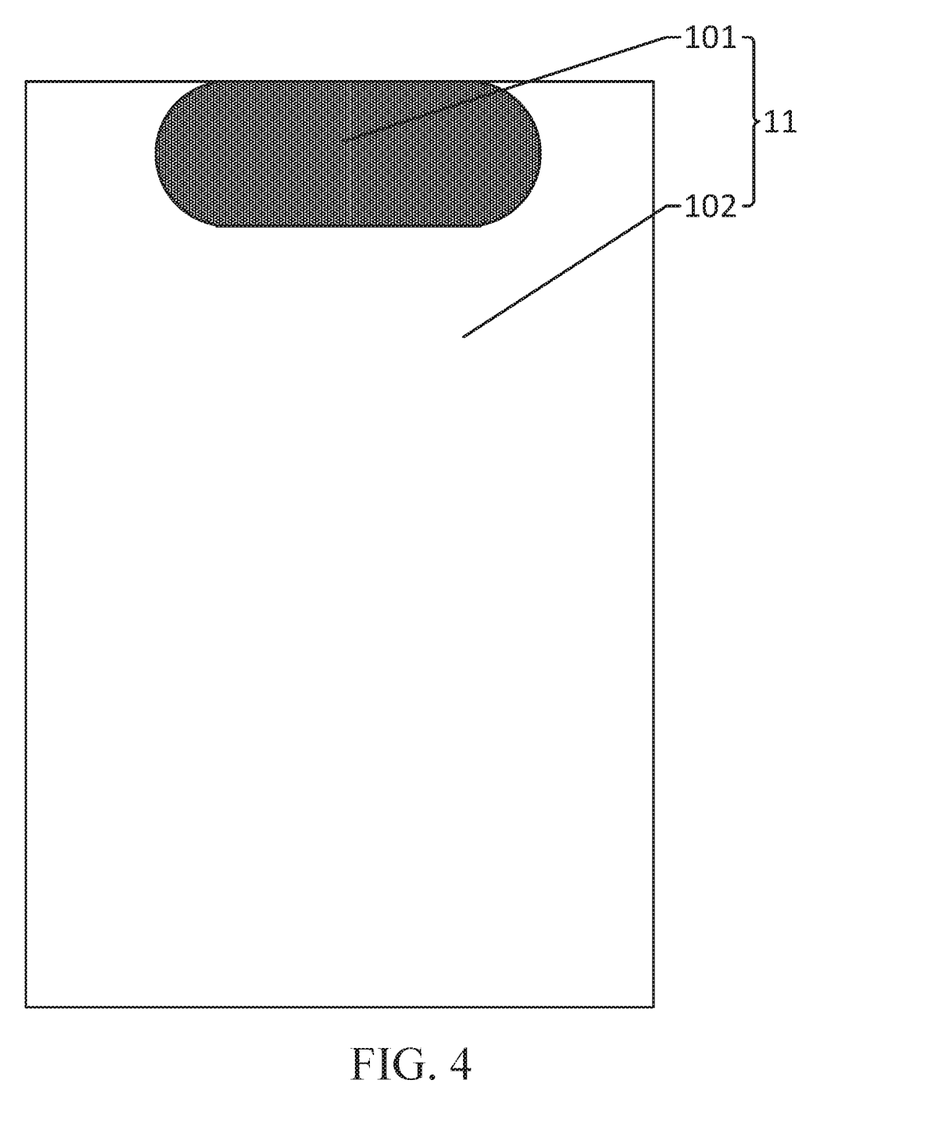
FIG. 4 is a schematic diagram of a camera area according to an embodiment of the present disclosure.
Figure 5:
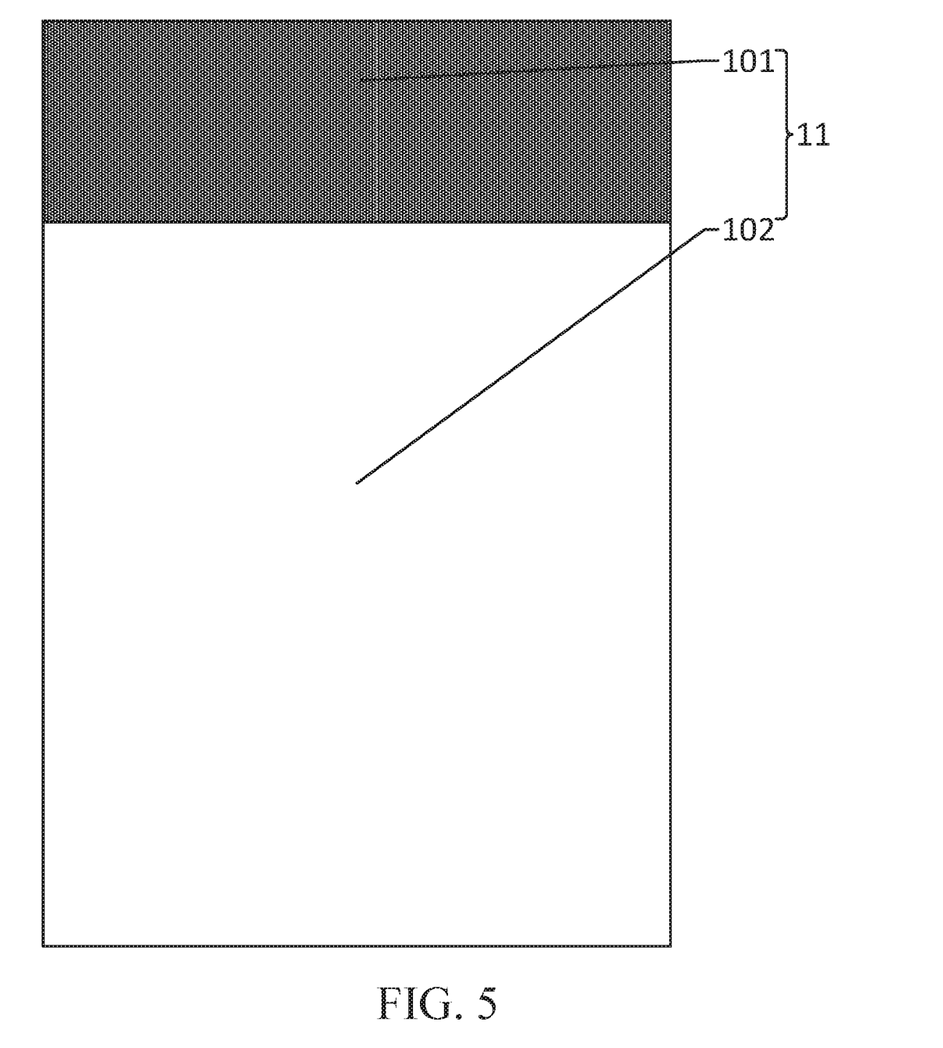
FIG. 5 is a schematic diagram of a camera area according to an embodiment of the present disclosure.

The present disclosure provides a display panel 10 comprising a display area 11. The display area 11 comprises a normal display sub-area 101 and a camera area 102. As shown in FIGS. 3-5, the camera area 102 is shaped as a circle or a rectangle.

Figure 1:
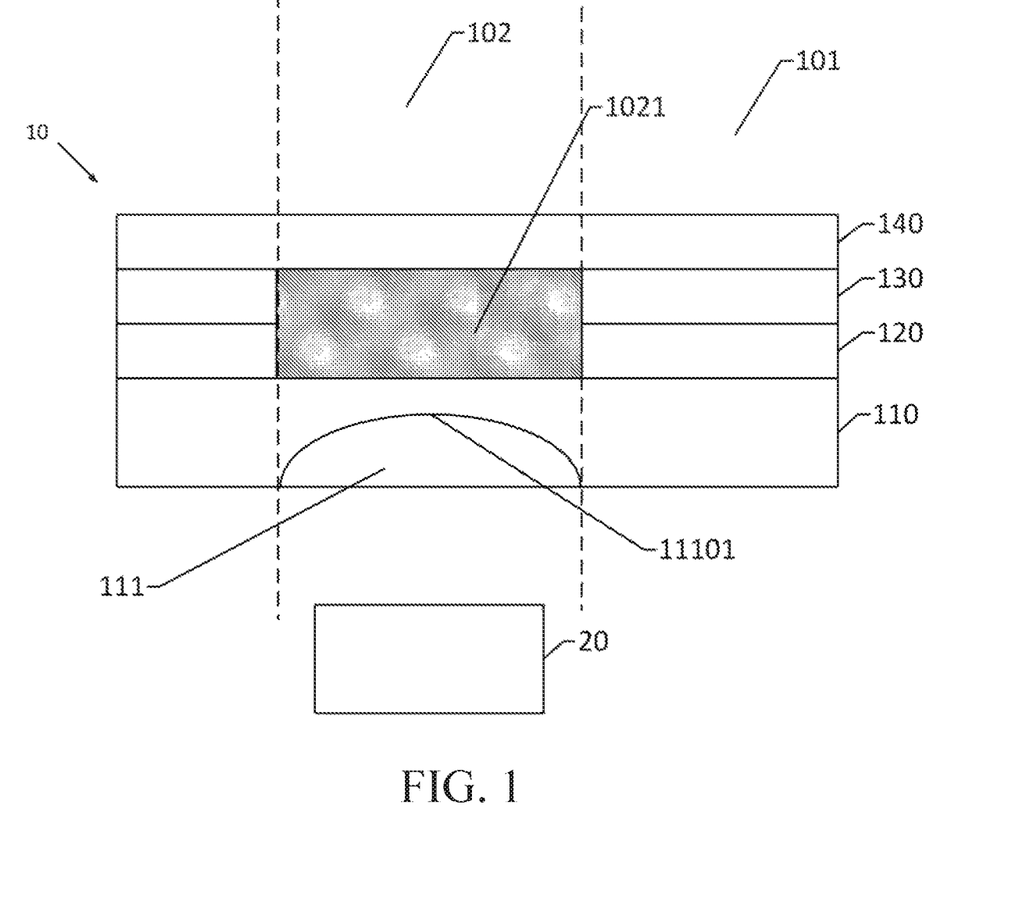
FIG. 1 is a schematic diagram of a display panel according to an embodiment of the present disclosure.

As shown in FIG. 1, the display panel 10 comprises a substrate 110, a thin film transistor layer 120, an organic light emitting layer 130, and an encapsulation layer 140.

The substrate 110 is a flexible substrate composed of a polyimide material or other similar flexible resin material, or a combination of a flexible resin material and an inorganic material. The substrate 110 is composed of a light transmissive material, so that light can pass through the substrate 110.

The thin film transistor layer 120 is disposed on the substrate 110. The thin film transistor layer 120 is provided with a circuit structure for providing power to the display panel 10.

The organic light emitting layer 130 is disposed on the thin film transistor layer 120. The organic light emitting layer 130 is generally composed of a plurality of regularly arranged pixel units. The pixel units comprise a red pixel unit, a green pixel unit, and a blue pixel unit. The various pixel units can emit red light, green light, blue light, white light and the like, so that the display panel 10 can display a colorful image.

In the display panel 10, the camera area 102 is disposed in the display area 11. In order to facilitate illumination of the camera area 102, a via hole 1021 is disposed in regions of the thin film transistor layer 120 and the organic light emitting layer 130 corresponding to the camera area 102. The via hole 1021 penetrates through the thin film transistor layer 120 and the organic light emitting layer 130. A shape and a size of the via hole 1021 are consistent with that of the camera area 102.

The via hole 1021 is filled with a light transmissive material. Light passes through the via hole 1021 to the camera 20 disposed under the display panel 10. The light transmissive material greatly reduces a loss of light passing through the display panel 10, thereby improving an imaging accuracy of the camera 20.

The light transmissive material is a polyimide material, which is convenient for curing and has high light transmittance.

Figure 2:
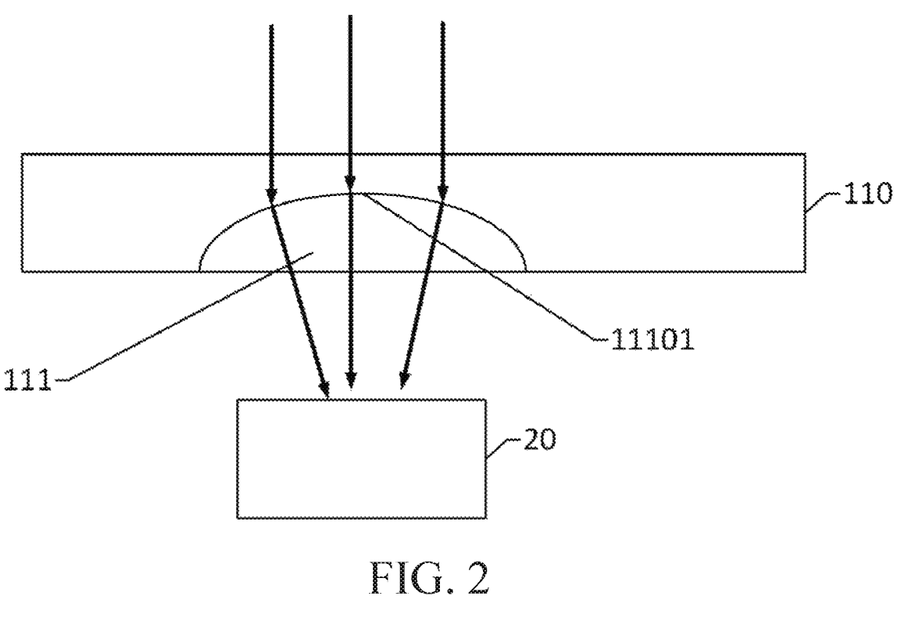
FIG. 2 is a schematic diagram showing refraction of light in a recess according to an embodiment of the present disclosure.

Because the imaging accuracy of the camera 20 mainly depends on intensity of external light, a region of the substrate 110 corresponding to the camera area 102 is provided with a recess 111, as shown in FIG. 2. The recess 111 corresponds to the via hole 1021. In order to concentrate light passing through the via hole 1021 into the camera 20, the recess 111 is shaped as a convex lens-shape. Specifically, an opening of the recess 111 faces the camera 20. The recess 111 comprises a bottom surface 11101. The bottom surface 11101 is concave to the substrate 110 and is shaped as an arc. In order to prevent the recess 111 from collapsing, in a preferred embodiment of the present disclosure, the recess 111 is filled with a light transmissive material.

The encapsulation layer 140 is disposed on a surface of the organic light emitting layer 130 away from the thin film transistor layer 120 for encapsulating the display panel 10 to prevent water, oxygen, and impurities from intruding into the display panel 10.

The encapsulation layer 140 is composed of at least one of silicon oxide, silicon nitride, silicon oxynitride, amorphous silicon, and other materials having water and oxygen barrier properties.

The present disclosure further provides a method for fabricating a display panel comprising:

S1) providing a substrate;

S2) forming a thin film transistor layer on the substrate;

S3) forming an organic light emitting layer on the thin film transistor layer;

S4) forming a via hole in regions of the thin film transistor layer and the organic light emitting layer corresponding to the camera area, wherein the via hole is formed by dry etching, wet etching, or laser etching;

S5) filling the via hole with a polyimide solution and curing the polyimide solution by heat or light; and S6) forming an encapsulation layer on the organic light emitting layer.

Figure 6:
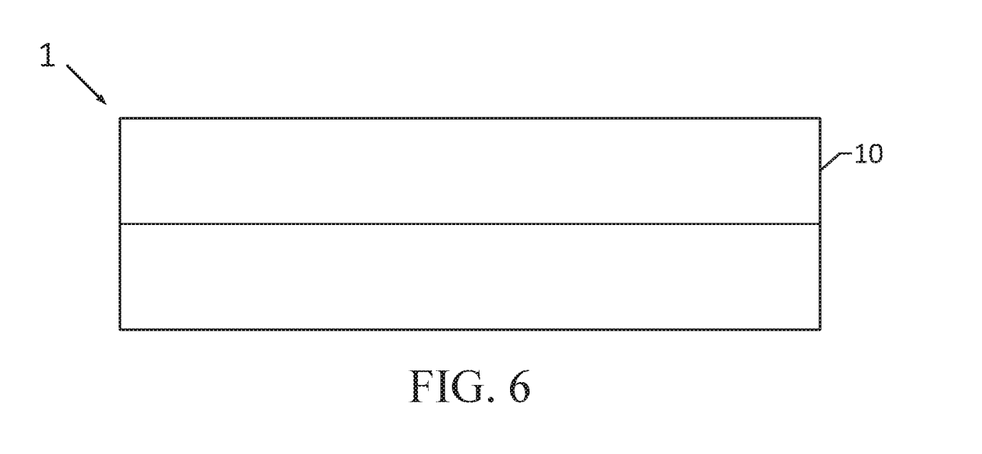
FIG. 6 is a schematic diagram of a display device according to an embodiment of the present disclosure.

As shown in FIG. 6, the present disclosure further provides a display device 1 comprising the display panel 10.

The main technical features and main technical effects of the display device 1 are collectively embodied in the display panel 10, and other components of the display device 1 are not described in detail.

The above are only the preferred embodiments of the present invention and are not intended to limit the present invention. Any modifications, equivalent substitutions, and improvements made within the scope of the present invention should be included in the scope of the present invention.

What is claimed is:

1. A display panel, comprising:
   a display area comprising a camera sub-area and a normal display sub-area;
   wherein the display panel comprises:

a substrate, wherein a thickness of a region of the substrate corresponding to the camera sub-area is less than a thickness of a region of the substrate corresponding to the normal display sub-area;

a thin film transistor layer disposed on the substrate;

an organic light emitting layer disposed on the thin film transistor layer; and an encapsulation layer disposed on the organic light emitting layer;

wherein a via hole is disposed in regions of the thin film transistor layer and the organic light emitting layer corresponding to the camera sub-area.

2. The display panel according to claim 1, wherein the via hole is filled with a light transmissive material.

3. The display panel according to claim 1, wherein a region of the substrate corresponding to the camera sub-area is provided with a recess, and an opening of the recess is disposed away from the thin film transistor layer.

4. The display panel according to claim 3, wherein the recess comprises a bottom surface that is shaped as an arc and is concave to the substrate.

5. The display panel according to claim 1, wherein the substrate is a flexible substrate composed of a polyimide material.

6. The display panel according to claim 1, wherein the encapsulation layer is composed of at least one of silicon oxide, silicon nitride, silicon oxynitride, and amorphous silicon.

7. A display device, comprising the display panel according to claim 1.

* * * * *